United States Patent
Guzuk et al.

[11] Patent Number: 5,153,379
[45] Date of Patent: Oct. 6, 1992

[54] SHIELDED LOW-PROFILE ELECTRONIC COMPONENT ASSEMBLY

[75] Inventors: Andrzej T. Guzuk, Pompano Beach; Todd W. Roshitsh, No. Lauderdale; Scott M. Engstrom; Lonnie L. Bernardoni, both of Coral Springs, all of Fla.

[73] Assignee: Motorola, Inc., Schaumburg, Ill.

[21] Appl. No.: 594,448

[22] Filed: Oct. 9, 1990

[51] Int. Cl.⁵ .................. H05K 9/00; H01L 23/02; H01L 23/28
[52] U.S. Cl. .................. 174/35 R; 174/52.2; 174/52.4; 357/72; 357/74; 361/424
[58] Field of Search ............ 174/35 R, 35 MS, 52.2, 174/52.4; 361/424; 357/72, 74

[56] References Cited

U.S. PATENT DOCUMENTS 4,967,315 10/1990 Schelhorn .................. 174/52.4

FOREIGN PATENT DOCUMENTS 0143498 6/1990 Japan .................. 174/35 R

*Primary Examiner*—Leo P. Picard
*Assistant Examiner*—Bot L. Ledynh
*Attorney, Agent, or Firm*—Pedro P. Hernandez

[57] ABSTRACT

A shielded low-profile electronic component assembly 100 providing shielding for electronic components is disclosed which includes a substrate 124, and shield 102. In a first embodiment the shield 102 is chamfered at each shield corner 110 and is attached to the substrate 124 at ground pad patterns 114, which are found at each corner of the substrate 124 on surface 128. A ground paddle 120 is also located in substrate 124 which lies substantially underneath the electronic component 112, and is utilized in maximizing shielding. In an alternate embodiment a substrate 124 is overmolded with encapsulation material 302 after the electronic component 112 is affixed to the substrate 124, with each of the encapsulation material corners 306 being chamfered exposing ground pads 114. The metallized shield 310 is then placed over the overmolded encapsulant and attached to the substrate 124 at ground pad patterns 114. The overmolded encapsulant 302 adding protection to the electronic component 112. In a third embodiment the metallized shield is slightly smaller in area than the substrate 124 and is attached at each of the four ground pads 114, with the shield edges 204 resting on substrate 124.

14 Claims, 4 Drawing Sheets

SHIELDED LOW-PROFILE ELECTRONIC COMPONENT ASSEMBLY

TECHNICAL FIELD

This invention relates generally to electronic component carriers, and more specifically to shielded low-profile electronic component carriers.

BACKGROUND

Electronic component carriers or as they are more commonly known chip carriers find use in a variety of electronic applications. Chip carriers provide encapsulation for electronic components, or dies, protecting them from the external environment. The carriers provide protection for the electronic components (i.e. IC die) during manufacturing, and testing of the electronic component assembly, and also later when they are placed into final products. Carriers also provide protection from dust, humidity, and other environental factors which can ruin the delicate dies.

One major problem associated with prior art carriers especially for use in high frequency devices is that they do not provide for shielding from radiation such as generated by external radio frequency interference sources (or from the device itself to other outside components). The ability to effectively shield high frequency circuits especially in electronic equipment such as two way radios is critical. Another major problem associated with prior art carriers is that they do not utilize the benefits of a thin drawn metallized shield in order to provide heatsinking and mechanical integrity to a low profile carrier assembly. Present art carriers tend to be to big for use in high density assembly applications.

As a result a need exists in the art for a low profile electronic component carrier which has good shielding, heatsinking, and mechanical integrity features especially when dealing with high frequency electronic circuits.

SUMMARY OF THE INVENTION

Briefly, according to the invention, an electronic component assembly includes a substrate and metallized shield. A pattern of conductive material is deposited on one of the substrate surfaces to form separate conductive pads for connection to respective terminals of an electronic component such as a high frequency IC die. A plurality of ground pad patterns are deposited on the substrate surface which act as metal anchors for the metallized shield. The electronic device can be encapsulated prior to attaching the shield using conventional encapsultation materials. The corners of the metallized shield are preferably chamfered allowing for the attachment of the shield to the ground pads. The shield preferably overhangs the substrate around the peripheral edge sides of the substrate and enhance the overall shielding effect.

In another aspect of the present invention the substrate is overmolded with encapsulation material after affixing the electronic component, leaving a section of each corner of the substrate exposed. The metallized shield lies on top of the encapsulation material and is attached to the substrate in each of the four ground pad patterns found in each corner of the substrate. The encapsulation material increases the protection to the electronic component by protecting if from dust, humidity, vibration, etc.

In still another aspect of the present invention the shield is designed slightly smaller in area than the substrate and is attached to the substrate in at least the four corner ground pad patterns. Optionally, an aperture can be placed on the shield allowing for encapsulation material to be injected into the housing assembly.

These and other aspects of the present invention will become apparent to those skilled in the art upon consideration of the accompanying specification, claims, and drawings.

DETAILED DESCRIPTION OF THE PREFERRED EMBODIMENT

Figure 1:
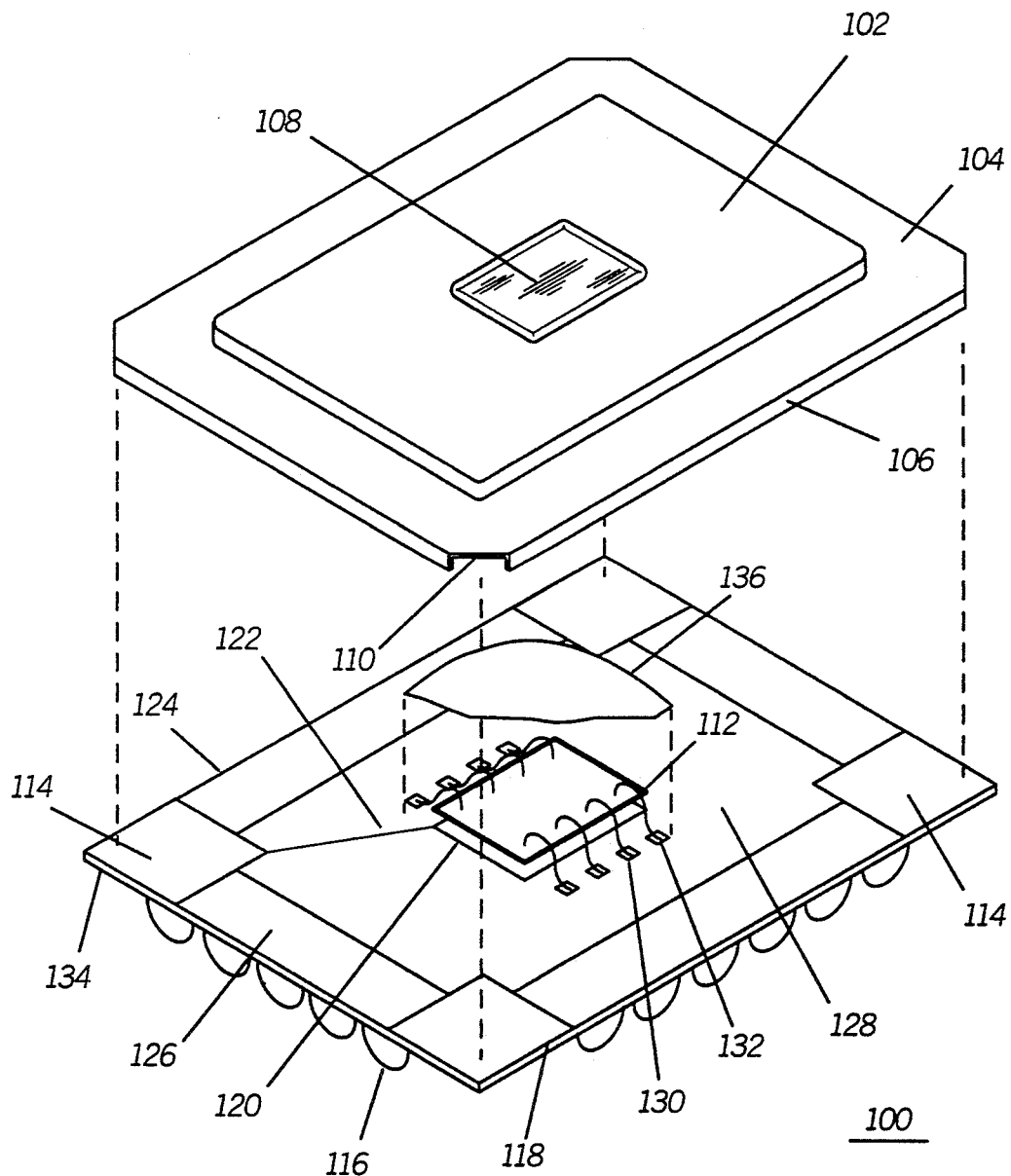
FIG. 1 shows an exploded view of a shielded low-profile electronic component assembly in accordance with the present invention.

Referring to FIG. 1, a shielded low-profile electronic component assembly (package) 100 embodying the present invention is shown. The assembly 100 is particularly suitable for high frequency IC's which require shielding in order to minimize interference into or out of the assembly 100. The assembly 100 includes a substrate 124 which is preferably formed of insulating material such as glass epoxy, ceramic, standard pc board materials such as FR4 (a glass epoxy mixture), or another suitable material chosen for its electrical insulating as well as heat dissipating characteristics. Substrate 124 has two major surfaces, 128 serving as a top surface, and 134 serving as the bottom surface. Peripheral edge sides 118 having a finite thickness surround the surfaces 128 and 134, with the thickness of the sides preferably being approximately 0.012 inches.

Low-profile package 100 also includes on its top surface 128 a pattern of conductive material resulting from substrate fabrication, or as a result of being deposited by anyone of a number of well known methods. The pattern of conductive material includes a plurality of separated conductive pads, such as pads 130, and 132. Ground pad patterns 114 are deposited on surface 128 at each of the four corners of substrate 124 which act as metal anchors for metallized shield 102. The substrate 124 thereby forms an electronic component carrier allowing for the reception of electronic components such as component 112. Preferably a ground die paddle 120 (conductive trace area) is deposited on surface 128 substantially underneath electronic component 112 for the purpose of enhancing the shielding component 112. The ground pad patterns 114 and the ground die paddle 120 can be electrically connected by way of electrical trace 122, which in turn can be connected to the ground pad of electronic component 112 thereby minimizing ground loop returns. Substrates regions 126 which are found along the sides of substrate 124 can also preferably be deposited with conductive material which can be grounded in order to enhance the shielding between substrate 124 and metallized shield 102. Substrate regions 126 are not required to be grounded if the design of the specific assembly does not allow for it (i.e. not enough room on the surface 128 to create the ground pads).

Substrate 124 is configured to have an electronic component 112 such as a semiconductor die having a plurality of terminals mounted on surface 128 at pads 130, 132, etc. as shown. Once the component is affixed preferably by conductive adhesive (soldering could also be used), the component can be encapsulated in order to protect the component from the environment. Encapsulation material 136 can be placed on top of component 112 before attaching shield 102 by way of any of a number of industry processes (e.g. glob top). Encapsulation improves the moisture resistance by significantly reducing penetratable surface areas. By also adding a shield over the glob top, moisture resistance in enhanced further by covering the encapsulation material.

Metallized shield 102 includes shield land area 104 which when attached to substrate 124 rests upon sustrate regions 126. Shield overhand 106 overhangs around peripheral edge sides 118 of substrate 124, enhancing the overall shielding effects of the electronic assembly 100. The shield overhang 106 eliminates the need to tightly control the flatness of the cut metal edges of shield 102 since the shield rests on the land area 104. The overhang 106 also helps in maintaining the shield position during manufacturing by captivating the shield 102 to substrate 124. The overhang 106 does not interfere with the motherboard which electronic assembly 100 is ultimately attached to since the overhang 106 is smaller than the thickness of the peripheral edge sides 118 and solder balls 116 combined. Shield corners 110 are chamfered allowing for the attachment of shield 102 at ground pads 114 during the assembly of the package 100 since the corners lie on top of pads 114. The shield 102 can be attached to ground pads 114 utilizing a number of well known techniques such as soldering or using conductive adhesives. If the particular electronic package 100 design permits, substrate regions 126 can also be grounded and attached to shield 102 for enhanced shielding performance. The peripheral edge sides 118 can also be attached to shield 102 thereby totally shielding the electronic package 100. Optionally, shield 102 can have a recess region 108 divertly overlying the electronic component 112 which rests closely to the electronic component 112 once the shield 102 is in place, allowing for enhanced heat transfer from component 112 to the shield 102.

The major advantage to the present invention is that the total height of the electronic assembly 100 can preferably be less than 0.060 inches. This includes the shield 102 attached to the substrate 124. While adding greater shielding and mechanical integrity to the overall electronic component assembly 100.

Bottom surface 134 which normally attaches to another external printed circuit board preferably utilizes solder balls 116 which are placed using a soldering technique referred to as controlled collapsible chip carrier connection (C5) process which is known in the art. Once the electronic assembly 100 is completed it is placed on another board (i.e. motherboard) for placement, where the board is reflowed allowing the two boards to attach to each other by reflowing the solder balls 116.

Figure 2:
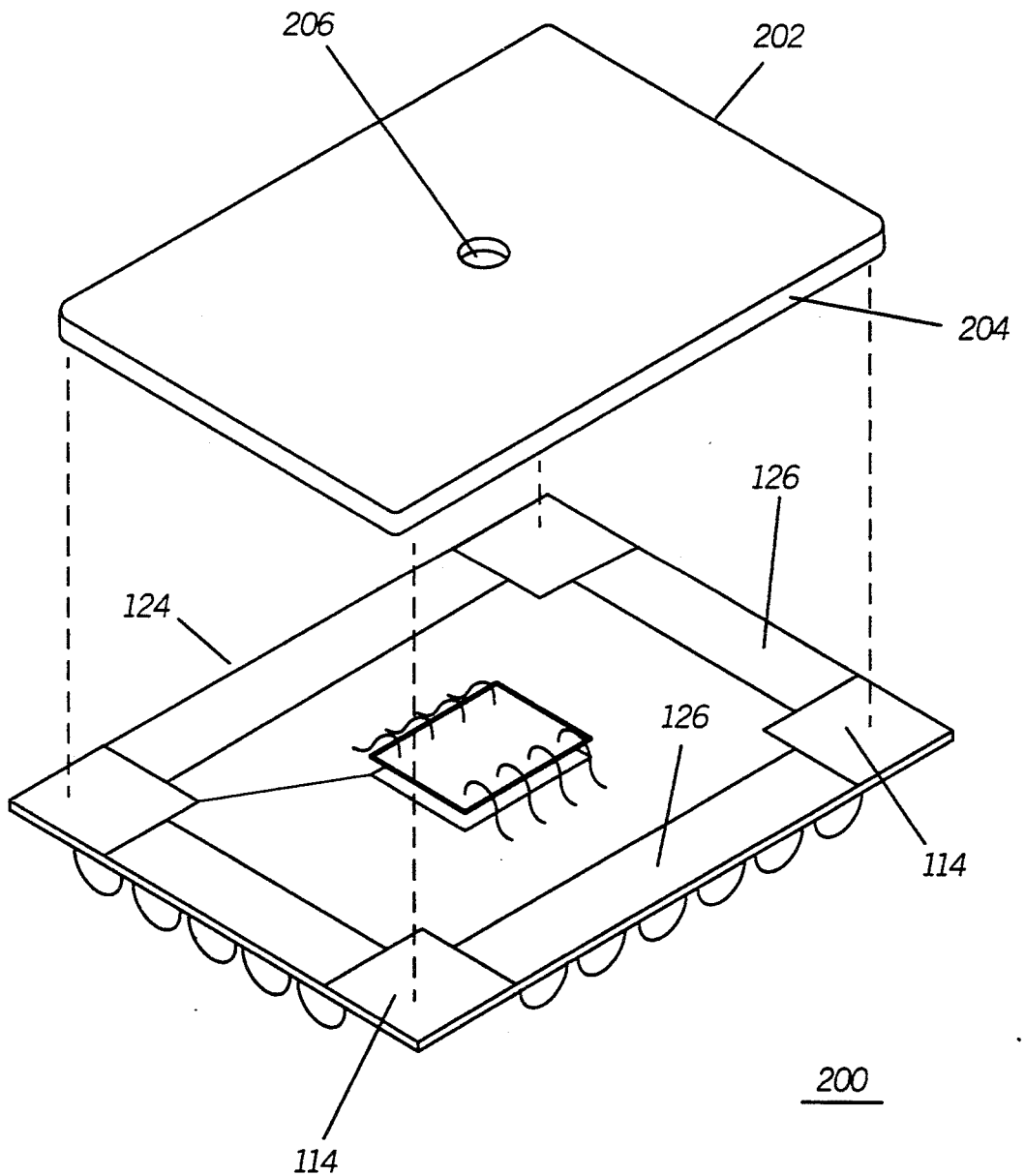
FIG. 2 is a diagram illustrating an alternte shielded low-profile IC assembly in accordance with the present invention.

FIG. 2 shows an alternate embodiment of a low-profile electronic assembly 200 having a metallized shield 202. The shield 202 in this embodiment is designed to be slightly smaller in area than the substrate 124 in order for shield edges 204 to rest on top of substrate 124. Shield 202 has shield edges 204 along the total peripheal unlike shield 102 which has chamfered corners. The shield 202 is then attached to ground pads 114 using anyone of a number of standard techniques known in the art. If substrate regions 126 can be grounded allowing for the shield 202 to also be attached at the substrate regions 126, enhancing the overall shielding of assembly 200.

Optionally, an aperture 206 can be placed on the shield 202 which can be used to inject conventional encapsulation material after the shield 202 has been attached to substrate 124.

Once the encapsulation material has been injected into the assembly 200, the aperture 206 can be shut if desired using conductive adhesives, solder, or other known materials. In this process the shield 202 acts as a mold for the encapsulation material.

Figure 3A:
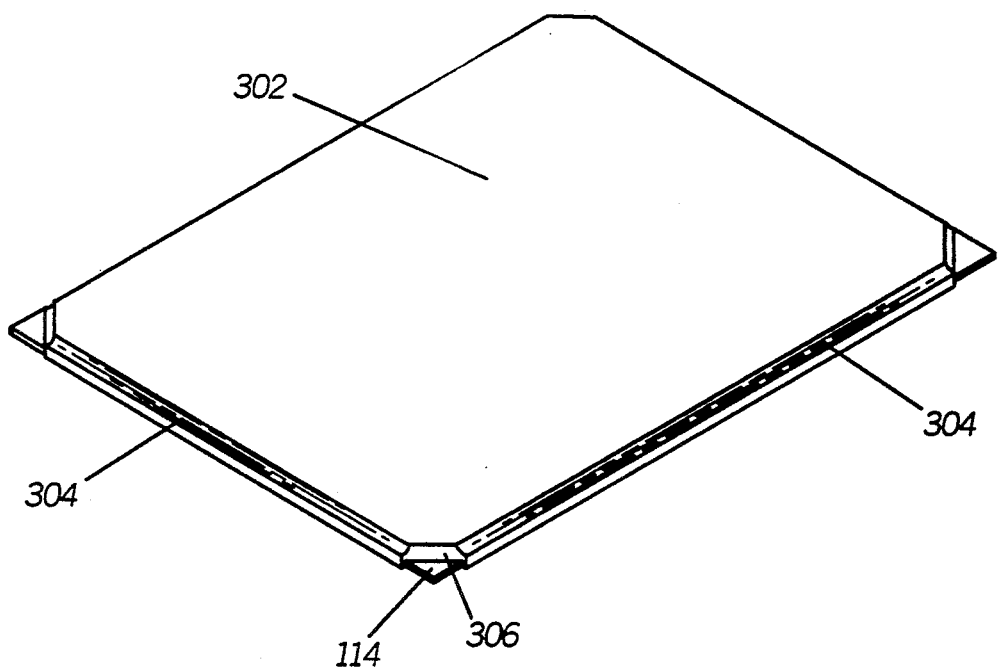
FIG. 3a shows a substrate overmolded with encapsulant material in accordance with the present invention.

FIG. 3a shows an alternate embodiment of the present invention in which, after the electronic component 112 is afffixed to the substrate 124, and encapsulant material 302 is overmolded over the substrate 124. The encapsulation material 302 can be anyone of many materials used in the art to encapsulate electronic components. The encapsulant is molded using standard industry overmolding processes. The encapsulation material 302 is molded with the four corners chamfered exposing the ground pad patterns 114 which are on substrate 124. A ridge 304 is also molded into the overmolded encapsulation material 302 along the peripheral sides of material 302. The encapsulation material 302 serves the purpose of protecting the electronic component 112 from the environment (e.g. humidity, dust, vibration).

Figure 3B:
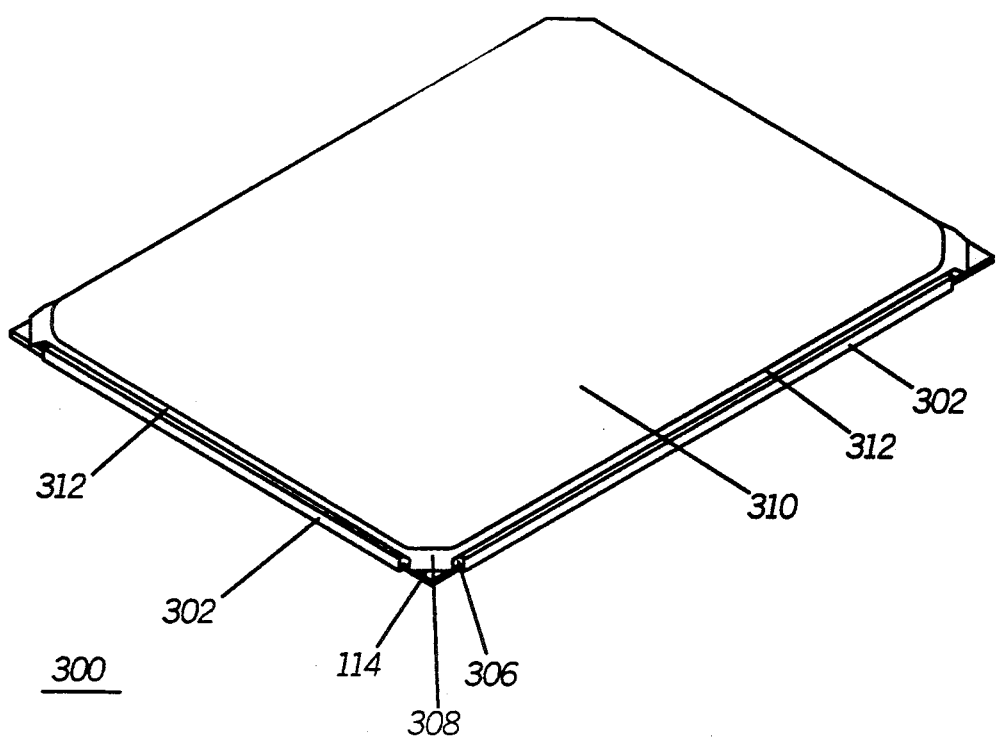
FIG. 3b shows a metallized shield attached to a substrate, with the substrate overmolded with encapsulant material in accordance with the present invention.

FIG. 3b shows a metallized shield 310 which is similar to shield 102 placed over the overmolded encapsulation material 302. The shield 310 in this case is designed with tabs 308 at each corner of shield 310. The tabs 308 are then attached to the substrate 124 at ground pads 114. The shield overhang 312 rests on top of recess 304 all around the peripheral sides of the electronic assembly 300.

Figure 4A:
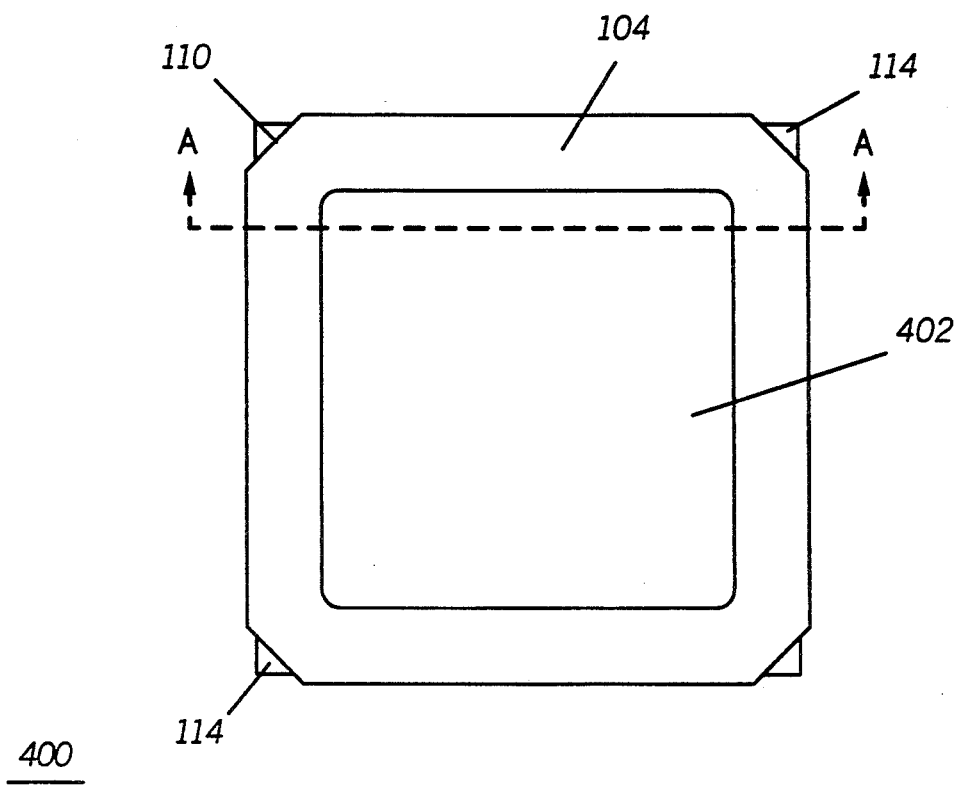
FIG. 4a shows a top view of a shielded low-profile electronic component assembly in accordance with the present invention.

FIG. 4a shows a top view of a shielded assembly 400 such as the one shown in FIG. 1. The shield 402 is preferably designed using 0.005 inches thick beryllium copper stock having a height of approximately 0.040 inches. Each of the shield corners 110 are chamfered allowing for a portion of the ground pads 114 to be exposed when the shield 402 is placed over the substrate 124. The shield 102 is then attached at the ground pads 114 thereby anchoring the shield 102 to the substrate 124.

Figure 4B:
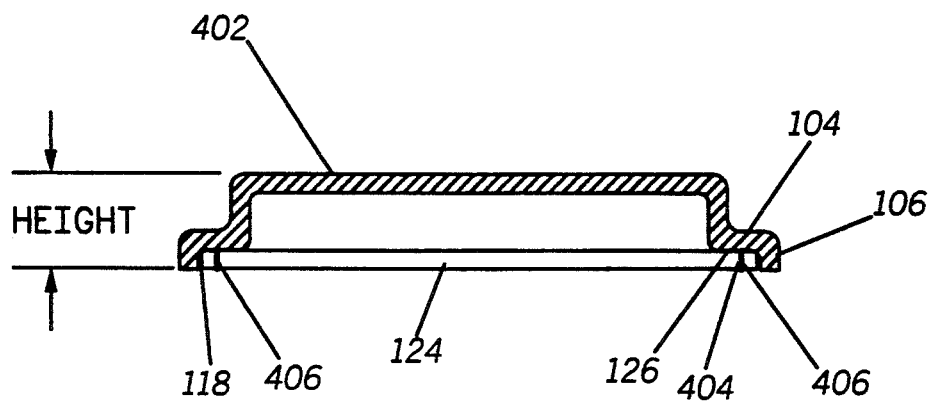
FIG. 4b is a diagram showing a partial cross-sectional view of FIG. 4a taken at line A—A.

FIG. 4b shows a cross sectional view of shield 402 taken at line A-A. The cross sectional view shows the shield land area 104 resting on substrate 124 along substrate regions 126. Also shown is the shield overhang 106 which lies around the shield peripheral side edges 118. Optionally, shield 402 can include pins 406 which are part of shield 402 and can be used to locate the position of shield 402 in respect to substrate 124. Substrate can include location apertures 404 for receiving pins 406, which can be plated with conductive material.

The pin can be attached to the aperture 404 preferably using conventional soldering techniques.

What is claimed is:

1. An electronic component assembly, comprising:
   an electronic component having a plurality of terminals;
   an electronic component carrier including a substrate having two major surfaces and peripheral edge sides joining the major surfaces, and a conductive pattern on one of the major surfaces for receiving the electronic component, and at least one ground pad pattern on the same major surface as the conductive pattern:
   the electronic component affixed to the one major surface of said electronic component carrier. the electronic component being encapsulated with encapsulant material substantially covering the electronic component; and
   a metallized shield attached to the ground pad pattern and substantially covering the electronic component.

2. An electronic component assembly according to claim 1, further comprising:
   a grounded die paddle on the major surface for receiving the electronic component, with the die paddle located substantially underneath the electronic component.

3. An electronic component assembly according to claim 1, wherein the metallized shield includes a recessed area overlying the electronic component allowing the recessed area to be closer to the electronic component.

4. An electronic component assembly, comprising:
   an electronic component having a plurality of terminals:
   an electronic component carrier including a substrate having two major surfaces and peripheral edge sides joining the major surfaces, and a conductive pattern on one of the major surfaces for receiving the electronic component, and at least one ground pad pattern on the same major surface as the conductive pattern:
   the electronic component affixed to the one major surface of said electronic component carrier: and
   a metallized shield attached to the ground pad pattern and substantially covering the electronic component: the metallized shield including a recessed area overlying the electronic component allowing the recessed area to be closer to the electronic component.

5. An electronic component assembly according to claim 4, wherein the metallized shield includes at least one pin, and the substrate includes at least one aperture for receiving the pin.

6. An electronic component assembly according to claim 4, wherein the metallized shield has an aperture, and the electronic component is encapsulated with encapsulation material substantially covering the electronic component.

7. An electronic component assembly, as defined in claim 6, wherein the overmolded encapsulant material has at least three corners, and is chamfered on the at least three corners exposing the one major surface area which has the electronic component affixed to it at the at least three corners, the encapsulant material also having a recess area substantially around the peripheral edge sides of the substrate, and the metallized shield having a metallized shield overhang which rests on the recess area of the encapsulant material.

8. An electronic component assembly according to claim 7, further comprising:
   a grounded die paddle on the major surface for receiving the electronic component, with the die paddle located substantially underneath the electronic component.

9. An electronic component assembly, comprising:
   an electronic component having a plurality of terminals;
   an electronic component carrier including a substrate having two major surfaces and peripheral edge sides joining the major surfaces, and a conductive pattern on one of the major surfaces for receiving the electronic component, and at least one ground pad pattern on the same major surface as the conductive pattern;
   the electronic component affixed to the one major surface of the electronic component carrier;
   an encapsulant material overmolded over the electronic component and substantially covering the one major surface area where the electronic component is affixed to, and having a portion of the at least one ground pad pattern not overmolded with encapsulant; and
   a metallized shield attached to the at least one ground pad pattern and substantially covering the overmolded encapsulant material.

10. An electronic component assembly, comprising:
    an electronic component having a plurality of terminals;
    an electronic component carrier including a substrate having a major surface having peripheral edge sides and a conductive pattern on the major surface for receiving the electronic component, and at least one ground pad pattern located on the major surface;
    the electronic component affixed to the major surface of said electronic component carrier; and
    a metallized shield attached to the ground pad pattern and substantially covering the electronic component, the metallized shield formed from a single piece of metal and having a shield land area which rests on the major surface of the substarte upon the metallized shield being attatched to the substrate, the metallized shield further having a shield overhang which substantially overhangs the substrate peripherial edge sides.

11. An electronic component assembly according to claim 10, wherein the metallized shield corners are chamfered and are attached to the ground pad patterns.

12. An electronic component assembly according to claim 10, wherein the major surface includes grounded substrate regions substantially along the sides of the substrate, and the metallized shield land area is attached to the grounded substrate regions.

13. An electronic component assembly according to claim 10, wherein the height of the assembly is less than 0.060 inches.

14. An electronic component assembly as defined in claim 10, wherein the electronic component is encapsulated with encapsulation material substantially covering the electronic component.

* * * * *

UNITED STATES PATENT AND TRADEMARK OFFICE
CERTIFICATE OF CORRECTION

PATENT NO.   : 5,153,379
DATED        : October 6, 1992
INVENTOR(S)  : Guzik, et al It is certified that error appears in the above-identified patent and that said Letters Patent is hereby corrected as shown below:

Column 5, line 15, after the word carrier, delete "." and insert therefor -- , --

Signed and Sealed this

Twenty-first Day of June, 1994

Attest:

BRUCE LEHMAN

Attesting Officer

Commissioner of Patents and Trademarks